(12) United States Patent
Shin et al.

(10) Patent No.: US 7,463,399 B2
(45) Date of Patent: Dec. 9, 2008

(54) FLAT PANEL DISPLAY AND A METHOD OF DRIVING THE SAME

(75) Inventors: Hyun Soo Shin, Yongin-si (KR); Jae Kyeong Jeong, Yongin-si (KR); Yeon Gon Mo, Yongin-si (KR); Dong Un Jin, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 151 days.

(21) Appl. No.: 11/528,414

(22) Filed: Sep. 28, 2006

(65) Prior Publication Data

US 2007/0075943 A1    Apr. 5, 2007

(30) Foreign Application Priority Data

Sep. 28, 2005  (KR) ...................... 10-2005-0090739
Sep. 28, 2005  (KR) ...................... 10-2005-0090740

(51) Int. Cl.
*G02F 1/15* (2006.01)
*G02F 1/153* (2006.01)
*G09G 3/34* (2006.01)
*G09G 5/00* (2006.01)

(52) U.S. Cl. .................. 359/265; 359/266; 359/270; 359/275; 345/84; 345/76; 345/107; 345/204; 345/205; 257/59; 313/504

(58) Field of Classification Search ............... 359/265, 359/266, 270, 273, 275; 345/76, 77, 84–87, 345/107, 204, 205; 349/161; 257/59, 72; 313/504, 512; 361/679
See application file for complete search history.

(56) References Cited

U.S. PATENT DOCUMENTS

| | | | |
|---|---|---|---|
| 6,563,174 B2 | 5/2003 | Kawasaki et al. | |
| 6,987,503 B2* | 1/2006 | Inoue | 345/107 |
| 7,170,225 B2* | 1/2007 | Han et al. | 313/504 |
| 2004/0155846 A1 | 8/2004 | Hoffman et al. | |
| 2006/0097631 A1* | 5/2006 | Lee | 313/504 |
| 2006/0109614 A1* | 5/2006 | Lee et al. | 361/679 |
| 2006/0220020 A1* | 10/2006 | Hwang | 257/59 |
| 2007/0057932 A1* | 3/2007 | Shin et al. | 345/204 |
| 2007/0069995 A1 | 3/2007 | Shin et al. | |

FOREIGN PATENT DOCUMENTS

EP          1 510 994          3/2005

(Continued)

OTHER PUBLICATIONS

European Search Report corresponding to European Patent Application No. 06255014.0-1228, issued on Jan. 17, 2007.

(Continued)

*Primary Examiner*—Loha Ben
(74) *Attorney, Agent, or Firm*—Robert E. Bushnell, Esq.

(57) ABSTRACT

The flat panel display includes an electrochromic device that is a controlling unit. The electrochromic device reversibly makes electrolytic oxidizing and reducing reactions so that coloring and decoloring can be made reversibly, when voltage is applied. With such the construction, the flat panel display controls the voltage applied to the electrochromic device, enabling to selectively display an image on front side or two sides.

21 Claims, 4 Drawing Sheets

FOREIGN PATENT DOCUMENTS

| | | |
|---|---|---|
| JP | 8-54832 | 2/1996 |
| JP | 2004-14982 | 1/2004 |
| JP | 2005-208125 | 8/2005 |
| WO | WO 2005/071131 | 8/2005 |

OTHER PUBLICATIONS

U.S. Appl. No. 11/519,928, filed Sep. 13, 2006, Shin et al.
Korean Office Action for Korean Patent Application No. 10-2005-0090740 issued on Nov. 17, 2006.

* cited by examiner

FLAT PANEL DISPLAY AND A METHOD OF DRIVING THE SAME

CROSS-REFERENCE TO RELATED APPLICATIONS AND CLAIM OF PRIORITY

This application claims the benefit accruing under 35 U.S.C. §119 from Korean Patent Application Nos. 2005-0090739 and 2005-0090740, filed on Sep. 28, 2005, in the Korean Intellectual Property Office, the disclosure of which is incorporated herein by reference. Furthermore, the present application is related to a co-pending U.S. application, Ser. No. 11/519,928, entitled FLAT PANEL DISPLAY AND ORGANIC LIGHT EMITTING DISPLAY based upon Korean Patent Application Serial No. 10-2005-0085412 filed in the Korean Intellectual Property Office on 13 Sep. 2005, and filed in the U.S. Patent & Trademark Office on 13 Sep. 2006.

BACKGROUND

1. Field of the Invention

The present invention relates to a flat panel display and a method of driving the same, and more particularly, to a flat panel display and a method of driving the same which maintains an opaque state depending on a user's desired time point or an established time point, while maintaining a transparent state at ordinary times, by forming a transparent two-side emission panel and a controlling unit on the lower portion of the transparent two-side emission panel, enabling to freely display an image on two sides or one side.

2. Discussion of Related Art

Demands on personal computers (PC), car navigation systems, personal digital assistants, information communication devices, and combination products of the above have recently increased with the advent of an information oriented society. The above-described products require characteristics of high visibility, a wide view angle, and display of moving images at high response speed. A flat panel display (FPD) is suitable for the above characteristics so that the FPD is spotlighted as a next generation display.

In general, a thin film transistor (TFT) has widely been used as a switching device that operates each pixel in a display device such as an organic light emitting display (OLED) or a liquid crystal display (LCD), etc. Therefore, significant attention is paid to fabrication of the TFT and a FPD using more effective TFTs and a method of driving the same are provided.

In the conventional FPDs, the semiconductor layer, the gate electrode, and the source and drain electrodes are formed of an opaque material. In particular, the semiconductor layer is formed of amorphous silicon or polysilicon. However, since these materials are not transparent, there are limitations on increasing the width of a channel due to the characteristics of the opaque semiconductor layer when an opaque TFT is used as the switching device of the organic light emitting display. Therefore, large current does not flow into the channel so that a high voltage must be applied to the TFT. Therefore, there has problems that the light emitting device of the conventional organic light emitting display deteriorates and power consumption increases. Also, it is not possible to select two-side emission or front side emission in accordance with a user's desired time point or the brightness of a circumference.

SUMMARY OF THE INVENTION

In order to achieve the foregoing objects of the present invention, according to one aspect of the present invention, there is provided a flat panel display (FPD) comprising a transparent two-side emission panel including a transparent thin film transistor; and a controlling unit connected to the transparent two-side emission panel, the controlling unit comprising an electrochromic device having a coloring agent, the controlling unit controlling transmission of light by changing color of the coloring agent, the color of the coloring agent being changed depending on oxidation and reduction reactions of the coloring agent when voltage is applied.

According to another aspect of the present invention, there is provided an organic light emitting display comprising: a display unit including an organic light emitting unit and at least a transparent thin film transistor for driving the organic light emitting unit; and a controlling unit formed below the display unit, the controlling unit comprising: a first transparent substrate connected to the display unit; a first transparent electrode mounted on the first transparent substrate; a second transparent electrode separated from the first transparent electrode by a predetermined distance and facing the first transparent electrode; a second transparent substrate on which the second transparent electrode is mounted; and the electrochromic device comprising an electrolytic layer containing a coloring agent filled between the first transparent electrode and the second transparent electrode, the electrochromic device controlling transmission of light by controlling color of the coloring agent, the color of the coloring agent being changed depending on oxidation and reduction reactions of the coloring agent when voltage is applied.

According to yet another aspect of the present invention, there is provided an organic light emitting display comprising: a transparent two-side emission panel including at least one transparent thin film transistor; and a controlling unit connected to the transparent two-side emission panel, the controlling unit comprising an electrochromic device having a coloring agent, the controlling unit controlling transmission of light to display an image selectively on one side or two sides of the FPD by applying voltage to the coloring agent to change color of the coloring agent.

The organic light emitting display unit comprises at least one transparent thin film transistor driving the organic light emitting element, wherein the transparent thin film transistor comprises a transparent semiconductor layer, a gate electrode, and source and drain electrodes, which are formed on the transparent substrate, a band gap of the transparent semiconductor layer is formed of wide band semiconductor substances larger than 3.0 eV, and the wide band semiconductor substances are formed of ZnO, ZnSnO, GaSnO, GaN or SiC.

Accordingly, in order to solve one or all of the problems as above, it is an object of the present invention to provide a flat panel display and a method of driving the same which maintains an opaque state depending on a user's desired time point or an established time point, while maintaining a transparent state at ordinary times, by forming a transparent two-side emission panel and a controlling unit on the lower portion of the transparent two-side emission panel, enabling to freely display an image on two-side or one side.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
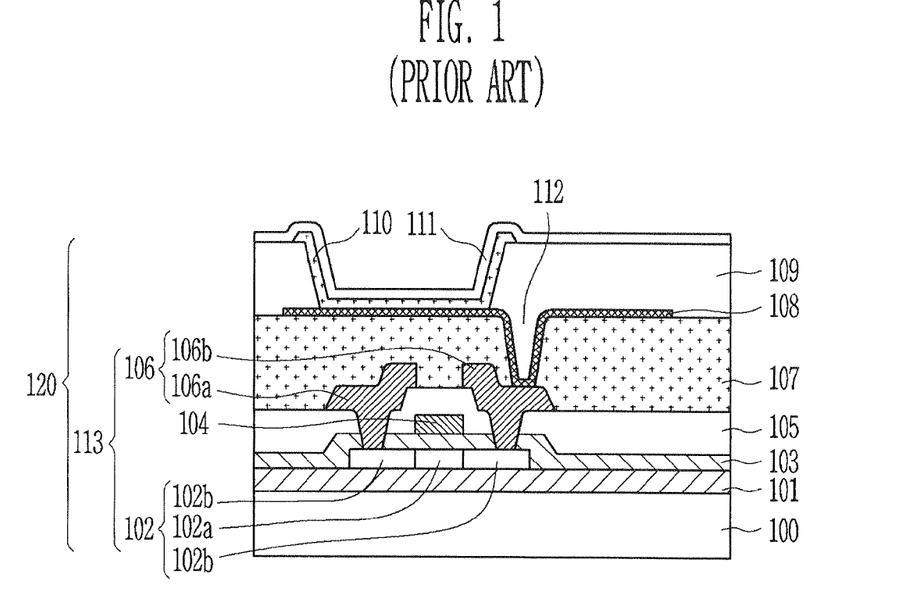
FIG. 1 is a schematic sectional view illustrating a conventional organic light emitting display (OLED)

FIG. 1 is a schematic sectional view of a general structure of an organic light emitting display to understand a basic concept of the organic light emitting display.

Referring to FIG. 1, a conventional organic light emitting display 120 comprises: a substrate 100; a buffer layer 101 formed on the substrate 100; a semiconductor layer 102 configured of an active layer 102a and an ohmic contact layers 102b formed on a region of the buffer layer 101; and a gate insulating layer 103 formed on the semiconductor layer 102. A gate electrode 104 is formed on a region of the gate insulating layer 103 and an interlayer insulating layer 105 is formed on the gate electrode 104. Source and drain electrodes 106a and 106b formed on a region of the interlayer insulating layer 105 are formed to be connected to exposed regions of the ohmic contact layers 102b and a planarization layer formed on the source and drain electrodes 106a and 106b. A first electrode layer 108 formed on a region of the planarization layer 107 is to be connected to exposed regions of the exposed source and drain electrodes 106a and 106b. A pixel defining layer 109 including an aperture 112 that allows at least a region of the first electrode layer 108 to be exposed is formed on the first electrode layer 108 and the planarization layer 107. An emission layer 110 is formed on the aperture, and a second electrode layer 111 is formed on the emission layer 110 and the pixel defining layer 109.

Hereinafter, a flat panel display (FPD) and a method of driving the same according to preferred embodiments of the present invention will be described with reference to the attached drawings.

In the specification and the claim sections, the word 'transparent' includes the meaning of 'transmissive' as well as 'transparent'. Also, in the specification, for convenience sake, a controlling unit connected to an emission panel of an organic light emitting display (OLED) is described. However, the present invention is not limited to the organic light emitting display, and can be applied to a liquid crystal display (LCD), a field emission display (FED), a plasma display panel (PDP), an electro luminescent display (ELD), and a vacuum fluorescent display (VFD).

Figure 2:
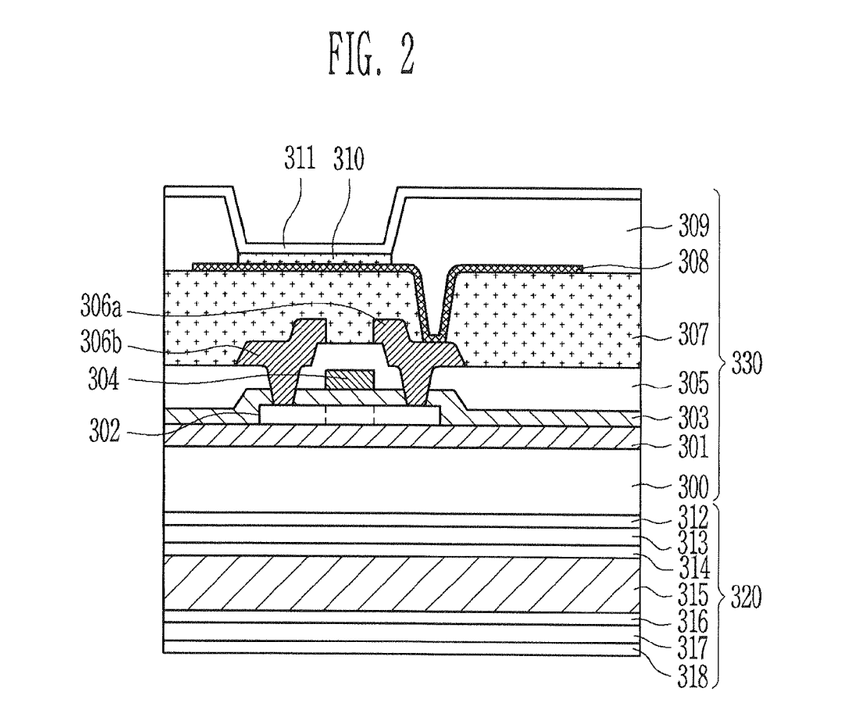
FIG. 2 is a schematic sectional view illustrating an organic light emitting display according to a first embodiment of the present invention.

FIG. 2 is a schematic sectional view illustrating an organic light emitting display according to a first embodiment of the present invention.

Referring to FIG. 2, the organic light emitting display includes: a display unit 330 including at least one organic light emitting diode and a thin film transistor formed on a region of a transparent substrate 300; and a controlling unit 320 formed on the lower portion of the display unit 330 to control intensity of light of the display unit 330.

Hereinafter, the controlling unit 320 will be described in more detail.

A first substrate 313 and a second substrate 317 of the controlling unit 320 are arranged to be opposite to each other. A first transparent electrode 314 is formed below (on the bottom side of) the first substrate 313 and a second transparent electrode 316 is formed above (on the top side of) the second substrate 317 A liquid crystal layer 315, which is a light shielding layer, is interposed between the first transparent electrode 314 and the second transparent electrode 316, and a first polarizing plate 312 and a second polarizing plate 318 are positioned above the first substrate 313 and below the second substrate 317, respectively.

The controlling unit 320 further comprises a controller (not shown) applying voltage to the first transparent electrode 314 and the second transparent electrode 316, and the controller (not shown) can be manually driven or automatically controlled by a photosensing.

The liquid crystal layer 315 can block or transmit light, as the voltage is applied from the controller (not shown) to the first transparent electrode 314 and the second transparent electrode 316.

For example, when the liquid crystal layer 315 of the controlling unit is a twisted nematic (TN), alignment of the liquid crystal molecules in the liquid crystal layer 315 changes depending on the magnitude of voltage applied between the first transparent electrode 314 and the second transparent electrode 316. In other words, the liquid crystal molecules in the liquid crystal layer 315 becomes 90° twisted when the voltage is off, and the liquid crystal molecules in the liquid crystal layer 315 is vertically aligned to the first or second substrate when the voltage is on.

Accordingly, when the voltage is off, the light from a light source is passed through a first polarizing plate 312 so that light passing through the first polarizing plate 312 a first linearly polarized light, of which the polarization is in line with a polarization axis of the first polarizing plate 312. The first linearly polarized light passes through the 90° twisted liquid crystal layer 315 so that it becomes a second linearly polarized light, which has a polarization that is in line with a polarization axis of the second polarizing plate 318. Thus, the second linearly polarized light may pass through the second polarizing plate 318 so that the screen of the controlling unit becomes a white or bright state.

When the voltage is on, the light from a light source is passed through a first polarizing plate 312 so that the light passing through the first polarizing plate 312 is a first linearly polarized light, of which the polarization is in line with a polarization axis of the first polarizing plate 312. Because the liquid crystal molecules of liquid crystal layer 315 are vertically aligned due to the voltage, the first linearly polarized light passing through the liquid crystal layer 315 is blocked by the second polarizing plate 318 so that the screen of the controlling unit 320 becomes a black or dark state.

The above example shows switching between a black state and a white state, but controlling unit 320 can display gray states between the black and white states by controlling magnitude of voltage applied between first transparent electrode 314 and second transparent electrode 316 of controlling unit 320. Degree of revolution (or transformation) of a first linear polarization depends on the degree of the twist, and degree of twist of liquid crystal molecules depends on the magnitude of the voltage. Therefore, degree of transformation of the first linear polarization is controlled by the voltage, and accordingly the light intensity transmitted through controlling unit 320 is controlled by the voltage.

Hereinafter, the display unit 330 will be described in more detail.

The display unit 330 is formed on the controlling unit 320. The display unit 330 includes: a transparent substrate 300; a buffer layer 301 formed on the transparent substrate 300; a transparent semiconductor layer 302 formed in a predetermined pattern on the buffer layer 301; a gate insulating layer 303 formed on the transparent semiconductor layer 302; a gate electrode 304 formed in the gate insulating layer 303 and patterned to correspond to the pattern of the transparent semiconductor layer 302; an interlayer insulating layer 305 formed on the gate electrode 304; source and drain electrodes 306a and 306b electrically connected to the transparent semiconductor layer 302 via a contact hole formed on the gate insulating layer 303 and the interlayer insulating layer 305; a planarization layer 307 formed on the source and drain electrodes 306a and 306b; a third electrode layer 308 formed on a region of the planarization layer 307 and formed to be connected to either of the source and drain electrodes 306a and 306b; a pixel defining film 309 formed on the third electrode layer 308 and having an aperture that at least partially exposes the third electrode layer 308; a emission layer 310 formed on a region of the pixel defining film 309 and the aperture; and a fourth electrode layer 311 formed on the upper portion of the emission layer 310.

The transparent substrate 300, for example, may be formed of insulating materials such as glass, plastic, sapphire, silicon or synthetic resins, etc. It is most preferable that the transparent substrate 300 is formed in a flexible thin film form.

The buffer layer 301 is formed on the transparent substrate 300. The buffer layer formed of a nitride film, an oxide film or transparent insulating materials, etc., but is not limited thereto.

The semiconductor layer 302 is formed of semiconductor material which has a wide band gap, preferably 3.0 eV or more and which has transparency. For example, the semiconductor layer 302 is formed of at least one selected from the group consisting of oxides such as ZnO, ZnSnO, CdSnO, GaSnO, TlSnO, InGaZnO, CuAlO, SrCuO, and LaCuOS, nitrides such as GaN, InGaN, AlGaN, and InGaAlN, and carbides such as SiC and diamond, etc.

The gate insulating layer 303 is formed on the transparent semiconductor layer 302, and insulates the transparent semiconductor layer 302 and the gate electrode 304. The gate insulating layer 303 is formed of an oxide film, a nitride film or transparent insulating materials, etc., but is not limited thereto.

The gate electrode 304 is formed on the gate insulating layer 303 and is formed on the upper portion of the channel region (not shown) of the transparent semiconductor layer 302 in a predetermined pattern. And, the gate electrode 304 and the source and drain electrodes 306a and 306b are formed of metals having good conductive and transparency such as indium tin oxide (ITO), indium zinc oxide (IZO), and indium tin zinc oxide (ITZO) and translucent metals, etc., but are not limited thereto.

The interlayer insulating layer 305 are formed on the gate electrode 304 and the interlayer insulating layer 305 may be formed of the same substances as the substances of the gate insulating layer 303.

And, the source and drain electrodes 306 and 306b are formed on the interlayer insulating layer 305, and are formed to be electrically connected to each side of the transparent semiconductor layer 302, respectively, via a contact hole formed on the gate insulating layer 303 and the interlayer insulating layer 305. Here, the source and drain electrodes 306a and 306 are formed of the same substances as the substances of the gate electrode 304.

The planarization layer 307 is formed on the source and drain electrodes 306a and 306b and the interlayer insulating layer 305, and is formed of a nitride film, an oxide film or transparent insulating materials, etc., but is not limited thereto. A via-hole formed by etching a portion of the planarization layer 307 is formed in the planarization layer 307. The third electrode layer 308 is electrically connected to either of the source and drain electrodes 306a and 306b through the via-hole formed on the planarization layer 307.

The pixel defining film 309 is formed on the third electrode layer 308, and has an aperture that at least partially exposes the third electrode layer 308. And, the emission layer 310 is formed on a region of the pixel defining layer 309 and the aperture, and can further include some of a hole injecting layer, a hole transporting layer, an electron injecting layer, and an electron transporting layer. The emission layer 310 emits light when holes and electrons injected from the third electrode layer 308 and the fourth electrode layer 311 are combined.

The fourth electrode layer 311 is formed on the emission layer 311 and the pixel defining film 309, and the third electrode layer and the fourth electrode layer 311 are formed of the same substances as the substances of the gate electrode 304.

Figure 3:
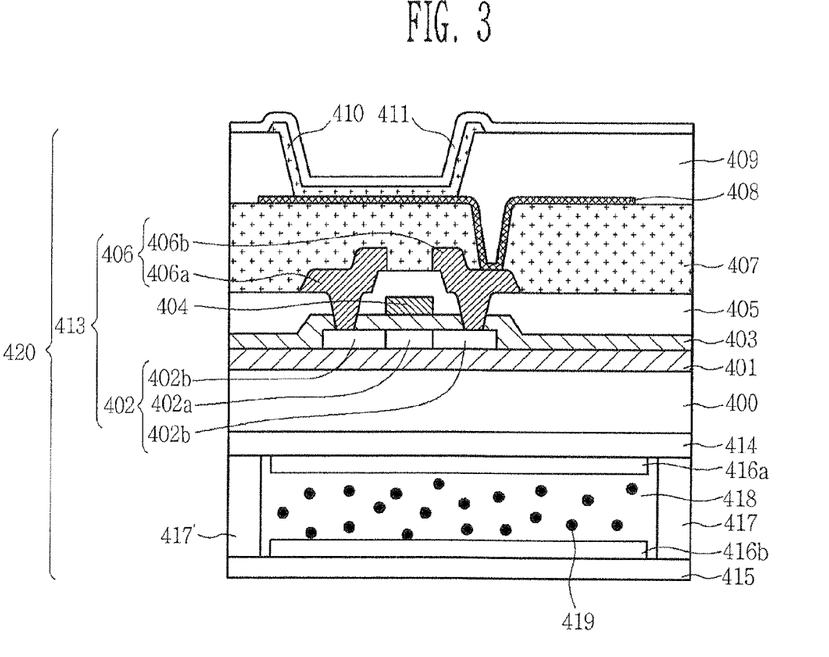
FIG. 3 is a schematic sectional view illustrating an organic light emitting display according to a second embodiment of the present invention.

FIG. 3 is a schematic sectional view illustrating an organic light emitting display according to a second embodiment of the present invention.

As shown in FIG. 3, on a substrate 400 of an organic light emitting display 420 according to an embodiment of the present invention is formed at least one transparent thin film transistor 413 and an emission unit including an emission layer 410.

And, the lower portion of the substrate 400 is attached with an electrophoretic device that is a controlling unit. The electrophoretic device is a non-emission type display device which is operated by using an electrophoretic phenomenon. According to the electrophoretic phenomenon, when an electric field is applied to a solution obtained by dispersing charged particles in a solvent, the charged particles migrate in the solution by Coulomb force. When particles in the form of capsules are dispersed in a solution and an electric shock is applied to the solution, the particles move in the solution to perform an electrical display.

The electrophoretic device formed below the substrate 400 according to an embodiment of the present invention includes a first transparent substrate 414 connected to one side of a transparent two-side emission panel and a second transparent substrate 415 separated from the first transparent substrate 414 by a predetermined distance and facing the first transparent substrate 414. A pair of first transparent electrodes 416a and 416b is mounted on the first transparent substrate 414 and the second transparent substrate 415 in a manner the pair of first transparent electrodes face each other. A pair of second electrodes (preferably a pair of second transparent electrodes 417), respectively, are mounted on both edge portions of the first transparent substrate 414 and the second transparent substrate 415. A solvent 418 into which charged particles 419 are dispersed is included between the first transparent substrate 414 and the second transparent substrate 415. The charged particles serve as a light shielding layer.

Each of the first transparent electrode 416a and 416b may be entirely formed on the first transparent substrate 414 or the second transparent substrate 415 and may be divided into a plurality of pieces.

A pair of second transparent electrodes 417 is formed on both ends of the internal space formed by the first transparent substrate 414 and the second transparent substrate 415. Although not shown in the drawing, spacers may be further provided outside the second transparent electrodes 417 to maintain a predetermined distance between the first transparent substrate 414 and the second transparent substrate 415.

The solvent 418 is filled between the first transparent substrate 414 and the second transparent substrate 415 and at least one charged particle 419 is dispersed into the solvent 418. The charged particles 419 are preferably black and are formed of materials having satisfactory charged characteristic to provide positive polarity or negative polarity. For example, the charged particles 419 are formed of inorganic pigment, organic pigment, carbon black, or resin containing the material. Also, the solvent has insulation property not to react to the charged particles and is preferably formed of a transparent non-polar solvent such as isoparaffin, silicon oil, xylene, and toluene.

A charge control agent for controlling charge of the charged particles 419 to stabilize the charge of the charged particles 419 may be added to the solvent 418 or the charged particles 419. Succinimide, metal complex of monoazo dye, salicylic acid, and organic silicon quaternary ammonium salt, and nigrosine compound are used as the charge control agent. A dispersion agent for preventing the charged particles 419 from being cohered in order to maintain the dispersion may be further added to the solvent 418. Polyvalent metal salt phosphate such as calcium phosphate and magnesium phosphate, carbonate such as calcium carbonate, inorganic salt, inorganic oxide, and organic polymer material are used as the dispersion agent.

There are no limitations on combination between the solvent and the charged particles. However, the solvent and the charged particles are preferably combined with each other at the same volume ratio in order to prevent the charged particles from sinking due to gravity.

A system controlling unit (not shown) for applying a voltage to the first transparent electrode 416a and/or 416b or the second transparent electrode 417 is included so that the voltage is selectively applied to the first transparent electrode 416a and/or 416b and the second transparent electrode 417 by the switch provided in the system controlling unit.

The thickness of the electrophoretic device attached under the substrate 400 is preferably 50 to 500 μm.

The solvent 418 and/or the charged particles 419 serve as a light blocking layer for blocking or transmitting light depending on the voltage applied to the first transparent electrode 416a and/or 416b and the second transparent electrode 417. Therefore, substances interposed in the first transparent electrode 416a and 416b and the second transparent electrode 417 are not limited to the solvent 418 or the charged particles 419, but any substances capable of being switched by applying voltage to the first transparent electrode 416 or the second transparent electrode 417 can be used. The substance satisfying conditions described above includes polymer dispersed liquid crystal (PDLC), for example.

IF voltage is not applied to PDLC, the liquid crystal molecules in the PDLC are arranged in irregular directions to cause scattering of light at an interface with a medium having a different index of refraction. And, if voltage is applied to the PDLC, the liquid crystal molecules in the PDLC are uniformly arranged in a direction so that light may be transmitted through the PDLC. As a result, light can be shielded or transmitted by selectively applying voltage to the first transparent electrode 416 and the second transparent electrode 417.

Figure 4:
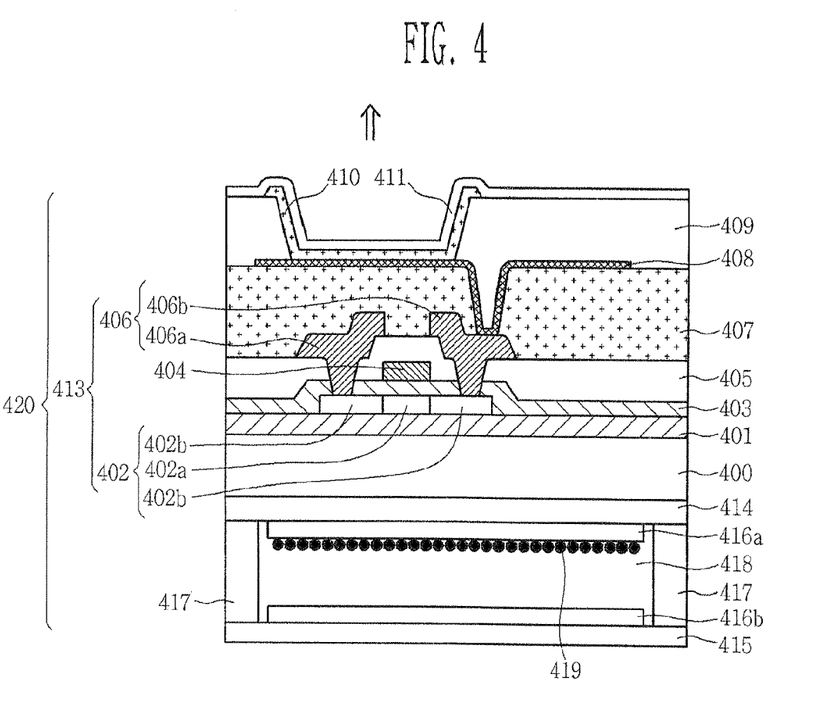
FIG. 4 is a schematic sectional view illustrating a state that voltage is applied to a first electrode in the second embodiment of the present invention.
Figure 5:
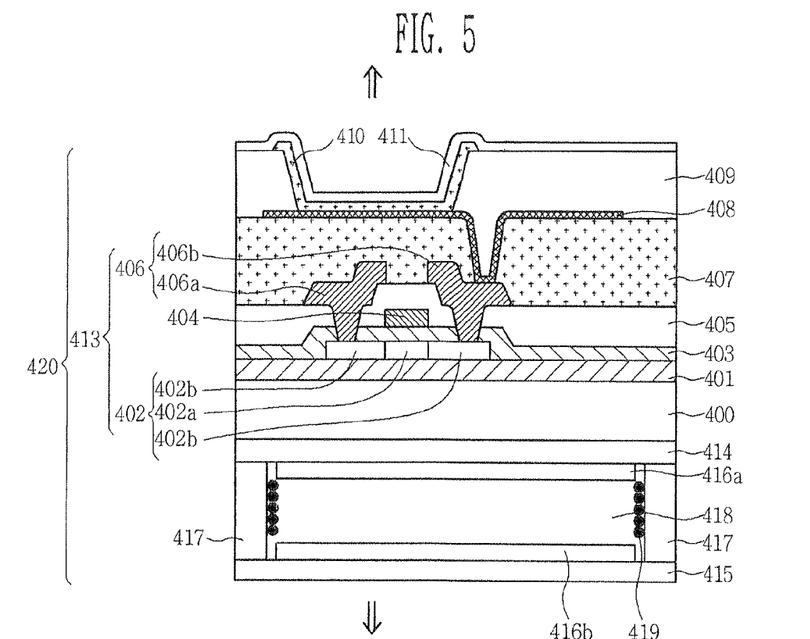
FIG. 5 is a schematic sectional view illustrating a state that voltage is applied to a second electrode in the second embodiment of the present invention.

FIGS. 4 and 5 are schematic sectional views illustrating a method of driving the OLED illustrated in FIG. 3. For convenience sake, detailed description of the same elements as those of FIG. 3 will be omitted. In particular, detailed description of the transparent TFT formed on the substrate and the material of the transparent TFT will be omitted.

FIG. 4 is a schematic sectional view illustrating a state that a voltage is applied to a first electrode 416a according to a second embodiment of the present invention.

Referring to FIG. 4, when the charged particles 419 have positive (+) charges, a negative (−) voltage is applied to the first transparent electrode 416a. When the negative (−) voltage is applied to the first transparent electrode 416a, the charged particles having the positive (+) charges migrate toward the first transparent electrode and are adsorbed to the first transparent electrode 416a. Since the charged particles 419 are black, the rear side from which light is emitted operates as a black matrix by the charged particles so that an OLED 420 according to an embodiment of the present invention emits light from the front side (i.e., the top direction in the drawings).

When the charged particles 419 have negative (−) charges, a positive (+) voltage is applied to the first transparent electrode 416a. When the positive (+) voltage is applied to the first transparent electrode 416a, the charged particles 419 having the negative (−) charges are adsorbed to the first transparent electrode 416a. Since the charged particles 419 are black, the rear side from which light is emitted operates as a black matrix so that the OLED 420 according to an embodiment of the present invention emits light from the front side (i.e., the top direction in the drawings).

FIG. 5 is a schematic sectional view illustrating a state that a voltage is applied to a second electrode according to the second embodiment of the present invention.

Referring to FIG. 5, when the charged particles 419 have the positive (+) charges, the negative (−) voltage is applied to the second transparent electrodes 417 in the form of barrier ribs that contact the first transparent substrate 414 and the second transparent substrate 415. Since the negative (−) voltage is applied to the second transparent electrode 417, the charged particles 419 having the positive (+) charges are adsorbed to the second transparent electrodes 417. Therefore, the rear side of an OLED 420 according to an embodiment of the present invention from which light is emitted becomes transparent so that the OLED 420 emits light from two sides.

When the charged particles 419 have the negative (−) charges, the positive (+) voltage is applied to the second transparent electrodes 417. Since the positive (+) voltage is applied to the second transparent electrode 417, the charged particles 419 having the negative (−) charges are adsorbed to the second transparent electrodes 417. Therefore, the rear side of the OLED 420 according to an embodiment of the present invention from which light is emitted becomes transparent so that the OLED 420 emits light from two sides.

According to the flat panel display of the present invention, the voltage applied to the first transparent electrode or the second transparent electrode is controlled, thereby making it possible to selectively display an image on front side or two sides (i.e., front and rear) at a user's desired time point.

Figure 6:
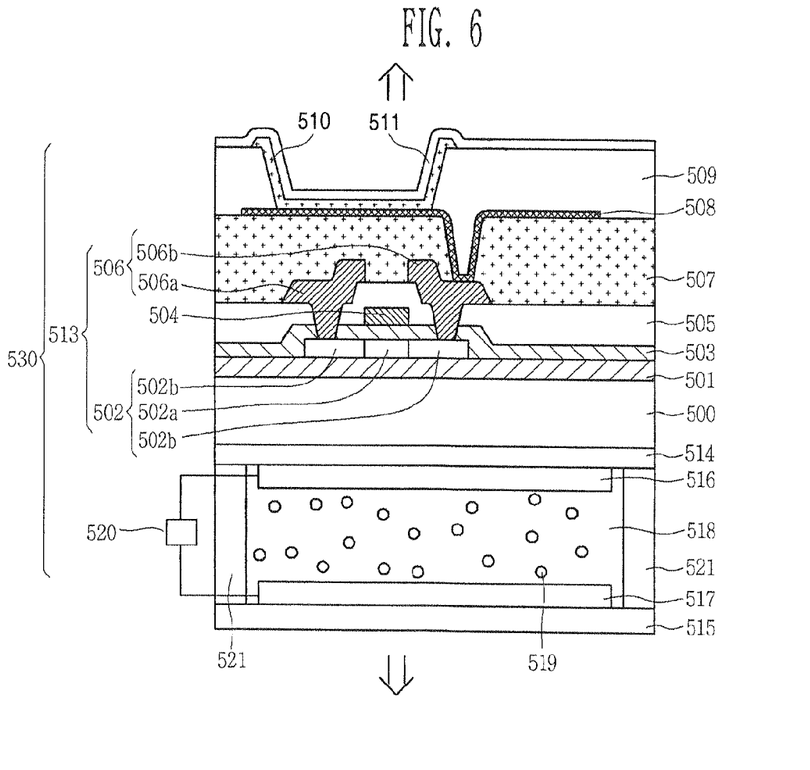
FIG. 6 is a schematic sectional view illustrating a state that voltage is not applied to an organic light emitting display according to a third embodiment of the present invention.

FIG. 6 is a schematic sectional view illustrating a state that voltage is not applied to an organic light emitting display according to a third embodiment of the present invention;

As shown in FIG. 6, on a substrate 500 of the OLED 530 according to an embodiment of the present invention are at least one transparent TFT 513 and a emission unit including an emission layer 510.

The lower portion of the substrate is attached with an electrochromic device that is a controlling unit. In general, electrochromism is a phenomenon reversibly making electrolytic oxidizing and reducing reactions so that coloring and decoloring can be made reversibly, when voltage is applied. The electrochromic device using the phenomenon has been used as a light amount controller (for example, a mirror such as an antiglare mirror or a light control glass, etc., or a brightness controlling element such as an organic light emitting diode, etc.) or a display element for numeric display using a segment, an electrochromic display, etc. The electrochromic device can mainly be divided into a solution type and a complete solid type in accordance with a material type of an electrochromic layer constituting the electrochromic device.

In the electrochromic device attached to the lower portion of the substrate 500 according to an embodiment of the present invention, the first transparent substrate 514 and the second transparent substrate 515 are formed to face each other on the substrate 500 at a predetermined distance. The spacers 521 may be formed between the first transparent substrate 514 and the second transparent substrate 515 to allow the first transparent substrate 514 and the second transparent substrate 515 to have a predetermined distance. The first transparent substrate 514 and the second transparent substrate 515 may be formed of a transparent glass substrate such as quartz glass plate and a white board glass plate, etc, but are not limited thereto. For example, the first transparent substrate 514 and the second transparent substrate 515 may be formed of ester such as polyethylenenaphthalate and polyethyleneterephthalate, etc.; cellulose ester such as polyamide, polycarbonate, and cellulose acetate, etc.; fluoropolymer such as polyvinylidene fluoride and polytetrafluoroethylenecohexafluoropropylene, etc.; polyether such as polyoxymethylene, etc.; polyolefin such as polyether, polyacetal, polystyrene, polyethylene, polypropylene, and methylpentenepolymer, etc.; and polyimide such as polyimide amide and polyether imide, etc.

The first transparent electrode 516 and the second transparent electrode 517 are formed on the first transparent substrate 514 and the second transparent substrate 515, respectively, to face each other. A film of ITO, SnO, InO, ZnO, and the like may be used as the first transparent electrode 516 and the second transparent electrode 517. The first transparent electrode 516 and the second transparent electrode 517 can be formed by known methods such as a deposition method, an ion plating method, and a sputtering method, etc.

The electrochromic layer filled with an electrolyte 518 containing a coloring agent 519, which is a light shielding layer, is formed between first transparent electrode 516 and the second transparent electrode 517. The electrochromic layer can be configured of electrolyte obtained by dissolving, for example, cathode compound such as viologen derivative, etc., and anode compound such as metallocene($M(C_5 G_5)_2$) or its derivative, into non-aqueous solvent.

A controller 520 may be further formed between the first transparent electrode 516 and the second transparent electrode 517. The controller 520 may be formed with a switch (not shown), which switches a magnitude of voltage. Therefore, by operating the switch, the first transparent electrode 516 is supplied with a first voltage or a second voltage so that chemical reaction is generated in the electrochromic layer. Detailed description of chemical reaction will be described with reference to FIGS. 7 and 8.

Further, a sealing member (not shown) is formed around the first transparent substrate 514 and the second transparent 515 to prevent a leak of the electrolyte 518 and to bond the first transparent substrate 514 and the second transparent 515. The thickness between the first transparent substrate 514 and the second transparent substrate 515 is preferably in the range of 10 to 100 μm.

If voltage is not applied between the first transparent electrode 516 and the second transparent electrode 517, the electrolyte 518 containing the coloring agent 519 is transparent so that the OLED 530 according to an embodiment of the present invention emits light from two-sides.

Figure 7:
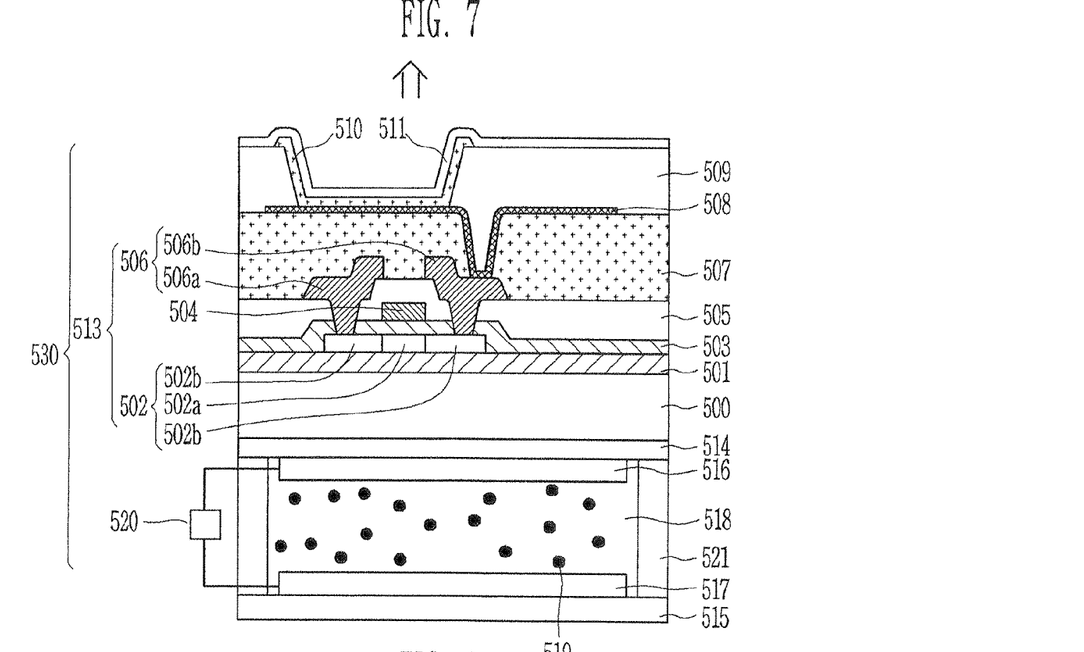
FIG. 7 is a schematic sectional view illustrating a state that a predetermined voltage is applied to the organic light emitting display according to the third embodiment of the present invention.
Figure 8:
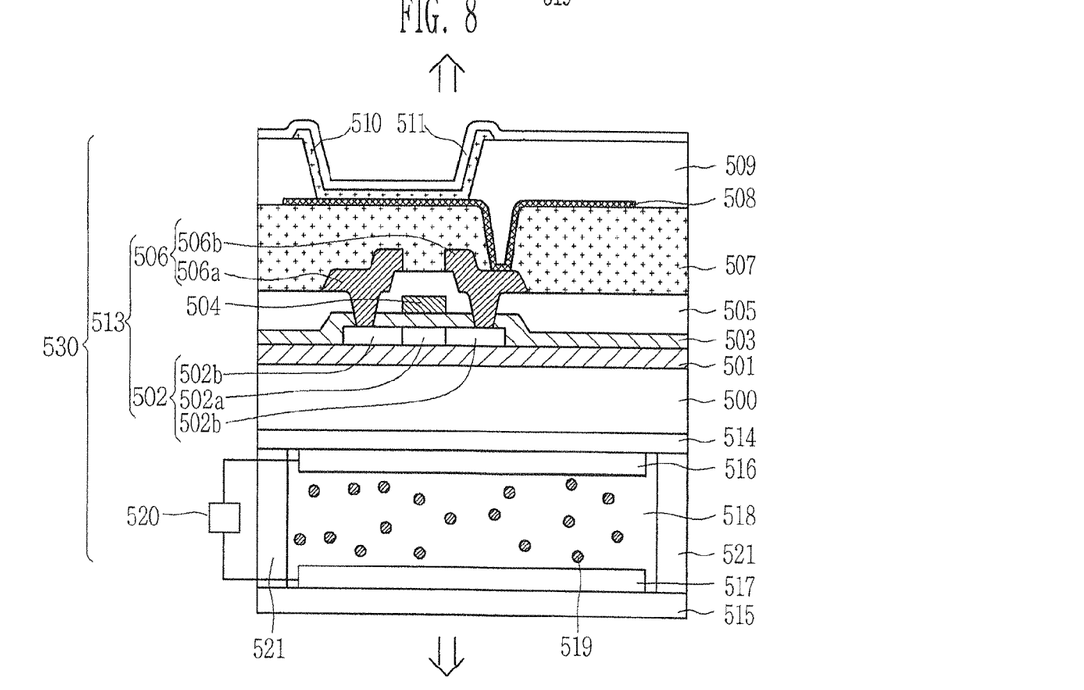
FIG. 8 is a schematic sectional view illustrating another state that a predetermined voltage is applied to the organic light emitting display according to the third embodiment of the present invention.

FIGS. 7 and 8 are schematic sectional views illustrating a method of driving an OLED according to a third embodiment of the present invention. For convenience sake, detailed description of the same elements as those of FIG. 3 will be omitted. In particular, detailed description of a transparent thin film transistor and materials of the transparent thin film transistor will be omitted.

FIG. 7 is a schematic sectional view illustrating a state that a predetermined voltage (a first voltage) is applied to the electrochromic device of the organic light emitting display 530 according to the third embodiment of the present invention.

Referring to FIG. 7, the first voltage is applied between a first transparent electrode 516 and a second transparent electrode 517. An electrolyte 518 containing a coloring agent 519 changes its own color by oxidation and reduction reactions. The coloring agent is colored by electrochemical reaction inside an electrochromic layer that is a coloring layer.

For example, a reaction equation 1 is a reduction and oxidation reaction of a typical viologen derivative. The viologen is in a transparent state as $Bipm^{2+}$ when voltage is not supplied, but if voltage is applied to the viologen, reduction reaction is generated in the electrochromic layer to change the state of the viologen into a $Bipm^+$ state, thereby indicating a deep black. Likewise, if oxidation reaction is generated in the electrochromic layer, the viologen changes its color from a deep black to a transparent state.

[Reaction equation 1]

As can be seen from a chemical equation 1, if the viologen is applied with the first voltage, the viologen reacts as shown in a chemical equation 1 to change its color from a transparent state to a deep black. In the chemical equation 1, each of $R_1$ and $R_2$ indicates a phenyl group or an alkyl group having 1 to 10 carbon atoms. Likewise, if oxidation reaction is generated, the viologen changes its color from a deep black to a transparent state.

[Chemical equation 1]

That is, if the first predetermined voltage is applied between the first transparent electrode 516 and the second transparent electrode 517, when reduction reaction is generated in the electrochromic layer, the electrochromic layer changes its color from a transparent state to a deep black to serve as a black matrix so that the organic light emitting display 530 according to an embodiment of the present invention can emit light only from a front side (i.e., the top side in FIG. 7). Also, when oxidation reaction is generated in the electrochromic layer, the electrochromic layer changes its color from a deep black to a transparent state so that the OLED 530 according to an embodiment of the present invention can emit light from two sides.

FIG. 8 is a schematic sectional view illustrating another state that a predetermined voltage (a second voltage) is applied to the organic light emitting display 530 according to the third embodiment of the present invention.

Referring to FIG. 8, the second voltage higher than the first voltage in FIG. 5 is applied between a first transparent electrode 516 and a second transparent electrode 517 by a switch (not shown) provided on the controller 520.

A reaction equation 2 is a reduction and oxidation reaction equation of viologen derivative when the second voltage is applied to the viologen. The viologen applied with the first voltage becomes Bipm$^+$ state to indicate a deep black, but if the second voltage higher than the first voltage is applied to the viologen, the viologen changes its color to a light black. Likewise, if oxidation reaction is generated, the viologen changes its color from a light black to a deep black.

[Reaction equation 2]

As can be seen from a chemical equation 2, if the viologen applied with the first voltage is applied with the second voltage higher than the first voltage, the viologen reacts as a chemical equation 2 to change its color from a deep black to a light black. In the chemical equation 2, each of $R_1$ and $R_2$ indicates a phenyl group or an alkyl group having 1 to 10 carbon atoms. Likewise, if oxidation reaction is generated, the viologen changes its color from a light black to a deep black.

[Chemical equation 2]

That is, if the higher voltage is applied between the first transparent electrode 516 and the second transparent electrode 517, when reduction reaction is generated in the electrochromic layer, the electrochromic layer changes its color from a deep black to a light black to indicate gray tone. Also, when oxidation reaction is generated in the electrochromic layer, the electrochromic layer changes its color from a light black to a deep black so that light can be transmitted only from a front side.

As another example, a reaction equation 3 is anode compound reaction equation of metallocene. In the reaction equation 3, M indicates a metal.

[Reaction equation 3]

The examples of the coloring agent 519 of the electrochromic layer may include many substances such as aromatic amine, an oxidation reduction complex, phtalocyanine, a heterocyclic compound, fluoran, styryl, anthraquinone, and phtalicdiester, etc. The electrolyte 418 may include aqueous or non-aqueous liquid (electrolyte) and semi-solid (high polymer electrolyte), etc.

That is, the organic light emitting display according to an embodiment of the present invention controls the voltage applied to the electrochromic layer, enabling to selectively display an image on front side or two sides.

The organic light emitting display according to an embodiment of the present invention is further provided with an optical sensor or a voice sensor, enabling to freely display an image depending on light or voice.

In above-described embodiments, the TFT and the aperture overlap each other. However, the TFT and the aperture may not overlap each other. Also, according to the above-described embodiments, the coplanar TFT has been described. However, the present invention can be applied to a reverse coplanar structure, a staggered structure, and a reverse staggered structure.

As described above, the present invention relates to a flat panel display and a method of driving the same which maintains an opaque state depending on a user's desired time point or an established time point, while maintaining a transparent state at ordinary times, by forming a transparent two-side emission panel and a controlling unit on the lower portion of the transparent two-side emission panel, enabling to selectively display an image on two sides or one side and to improve image illuminance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flat panel display (FPD), comprising:
a transparent two-side emission panel including a transparent thin film transistor; and
a controlling unit connected to the transparent two-side emission panel, the controlling unit comprising an electrochromic device having a coloring agent, the controlling unit controlling transmission of light by changing color of the coloring agent, the color of the coloring agent being changed depending on oxidation and reduction reactions of the coloring agent when voltage is applied.

2. The FPD as claimed in claim 1, wherein the electrochromic device comprises:
a first transparent substrate connected to one side of the transparent two-side emission panel;
a first transparent electrode mounted on the first transparent substrate;
a second transparent electrode separated from the first transparent electrode by a predetermined distance and facing the first transparent electrode;
a second transparent substrate on which the second transparent electrode is mounted; and
the electrochromic device comprising an electrolytic layer containing the coloring agent filled between the first transparent electrode and the second transparent electrode.

3. The FPD as claimed in claim 2, wherein the electrochromic device further comprises a controller for controlling voltage between the first transparent electrode and the second transparent electrode.

4. The FPD as claimed in claim 3, wherein the controller further comprises a switch for changing voltage.

5. The FPD as claimed in claim 3, wherein the coloring agent is black when the voltage is applied to make the FPD a one-side emission display, and the coloring agent is transparent when the voltage is not applied to make the FPD a two-side emission display.

6. The FPD as claimed in claim 3, wherein the controller for controlling the voltage is able to supply at least two different voltages comprising a first voltage and a second voltage, and the coloring agent is transparent when the voltage is not applied, the coloring agent is a first color when the first voltage is applied, and the coloring agent is a second color different from the first color when the second voltage higher than the first voltage is applied.

7. The FPD as claimed in claim 2, further comprising a sealing member formed around the first transparent substrate and the second transparent substrate to prevent a leak of the electrolytic layer and to bond the first transparent substrate and the second transparent substrate.

8. The FPD as claimed in claim 2, further comprising spacers formed between the first transparent substrate and the second transparent substrate to maintain a predetermined distance between the first transparent substrate and the second transparent substrate.

9. The FPD as claimed in claim 2, wherein the thickness between the first transparent substrate and the second transparent substrate is in the range of 10 to 100 μm.

10. The FPD as claimed in claim 2, wherein the coloring agent is selected from the group consisting of a viologen derivative, metallocene($M(C_5 G_5)_2$), a derivative of metallocene, aromatic amine, an oxidation reduction complex, phtalocyanine, a heterocyclic compound, fluoran, styryl, anthraquinone, and phtalicdiester.

11. The FPD as claimed in claim 2, wherein the electrolytic layer is formed of one selected from the group consisting of aqueous liquid, non-aqueous liquid high polymer electrolyte.

12. The FPD as claimed in claim 1, wherein the FPD is an organic light emitting display.

13. An organic light emitting display (OLED) comprising:
a display unit comprising an organic light emitting unit and at least a transparent thin film transistor for driving the organic light emitting unit; and
a controlling unit formed below the display unit, the controlling unit comprising:
a first transparent substrate connected to the display unit;
a first transparent electrode mounted on the first transparent substrate;
a second transparent electrode separated from the first transparent electrode by a predetermined distance and facing the first transparent electrode;
a second transparent substrate on which the second transparent electrode is mounted; and
the electrochromic device comprising an electrolytic layer containing a coloring agent filled between the first transparent electrode and the second transparent electrode, the electrochromic device controlling transmission of light by changing color of the coloring agent, the color of the coloring agent being changed depending on oxidation and reduction reactions of the coloring agent when voltage is applied.

14. The OLED as claimed in claim 13, wherein the controlling unit further comprises a controller for controlling voltage between the first transparent electrode or the second transparent electrode.

15. The OLED as claimed in claim 14, wherein the controller further comprises a switch for changing voltage.

16. The OLED as claimed in claim 13, wherein the transparent thin film transistor comprises a transparent semiconductor layer, a transparent gate electrode, and transparent source and drain electrodes.

17. The OLED as claimed in claim 16, wherein the transparent gate electrode and the transparent source and drain electrodes are independently selected from the group consisting of indium tin oxide (ITO), indium zinc oxide (IZO) and indium tin zinc oxide (ITZO).

18. The OELD as claimed in claim 16, wherein the transparent semiconductor layer included in the transparent thin film transistor is formed of semiconductor material which has a wide band gap of at least 3.0 eV.

19. The OELD as claimed in claim 18, wherein the semiconductor material is formed of at least one selected from the group consisting of oxides including ZnO, ZnSnO, CdSnO, GaSnO, TlSnO, InGaZnO, CuAlO, SrCuO, and LaCuOS, nitrides including GaN, InGaN, AlGaN, and InGaAlN, and carbides including SiC and diamond, etc.

20. A flat panel display (FPD), comprising:
 a transparent two-side emission panel comprising at least one transparent thin film transistor; and
 a controlling unit connected to the transparent two-side emission panel, the controlling unit comprising an electrochromic device having a coloring agent, the controlling unit controlling transmission of light to display an image selectively on one side or two sides of the FPD by controlling voltage to the coloring agent in order to change color of the coloring agent.

21. The FPD as claimed in claim 20 having a display unit, wherein the FPD is an organic light emitting display having a display unit, and the display unit including an organic light emitting unit and the at least one transparent thin film transistor for driving the organic light emitting unit.

* * * * *